(12) United States Patent
Nakasato et al.

(10) Patent No.: US 7,759,581 B2
(45) Date of Patent: Jul. 20, 2010

(54) CIRCUIT BOARD AND METHOD FOR MANUFACTURING SEMICONDUCTOR MODULES AND CIRCUIT BOARDS

(75) Inventors: Mayumi Nakasato, Ogaki (JP); Hideki Mizuhara, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 444 days.

(21) Appl. No.: 11/765,138

(22) Filed: Jun. 19, 2007

(65) Prior Publication Data

US 2007/0290327 A1    Dec. 20, 2007

(30) Foreign Application Priority Data

Jun. 20, 2006  (JP)  .............................. 2006-169641
Jun. 8, 2007   (JP)  .............................. 2007-153292

(51) Int. Cl.
  *H01R 12/04*    (2006.01)
  *H05K 1/11*     (2006.01)
(52) U.S. Cl. ...................... 174/262; 361/792
(58) Field of Classification Search ......... 174/262–266; 361/792–795
  See application file for complete search history.

(56) References Cited

U.S. PATENT DOCUMENTS 6,492,201 B1 *  12/2002  Haba ........................... 438/121

FOREIGN PATENT DOCUMENTS

JP    2003-304063    10/2003

* cited by examiner

*Primary Examiner*—Jeremy C Norris
(74) *Attorney, Agent, or Firm*—Fish & Richardson P.C.

(57) ABSTRACT

A circuit board is provided with a metal plate, having openings, as core material. The opening gradually increases from a lower surface side toward an upper surface side of the metal plate. On both surface sides of the metal plate there are provided wiring patterns, respectively, via insulating layers. The insulating layer on an upper region of the opening and the corresponding wiring pattern are provided have a recess on the upper surface. To electrically connect each wiring pattern, the circuit board includes a conductor that penetrates the metal plate via the opening and which connects the wiring patterns with each other. An LSI chip is directly coupled to the upper surface side of the metal plate via a solder ball.

15 Claims, 10 Drawing Sheets

PRIOR ART

CIRCUIT BOARD AND METHOD FOR MANUFACTURING SEMICONDUCTOR MODULES AND CIRCUIT BOARDS

CROSS-REFERENCE TO RELATED APPLICATIONS

This application is based upon and claims the benefit of priority from both the prior Japanese Patent Application No. 2006-169641, filed Jun. 20, 2006 and the prior Japanese Patent Application No. 2007-153292, filed Jun. 8, 2007, the entire contents of which are incorporated herein by references.

BACKGROUND OF THE INVENTION

1. Field of the Invention

The present invention relates to a circuit board and a semiconductor module and it particularly relates to a circuit board provided with a metal plate in a core part.

2. Description of the Related Art

In recent years, along with increasing high function and high performance of LSIs (Large Scale Integrated Circuit), their power consumption is on the increase. With electronic devices getting smaller, mounting boards are also required to be smaller and high-density and multilayered. Accordingly, the power consumption per unit volume (heat density) of a circuit board rises, thus requiring measures to address the increased heat radiation. As a result, a metal plate having high heat radiation is used as a circuit board.

FIG. 10 is a cross-sectional view schematically showing a structure of a conventional circuit board. This conventional circuit board (metal core board) includes a metal plate (metal layer) 102 provided as core material, an opening (through-hole) 102a penetrating both sides of the metal plate 102, a wiring pattern 114 provided, by way of an insulating layer 104, on the both sides of the metal plate 102, and a conductor 110 which penetrates the metal plate 102 via the opening 102a and which electrically connects the wiring patterns 114 on the both sides. Here, the insulating layer 104 is formed in a manner that insulating resin sheets are thermally bonded from the both sides thereof, with the metal plate 102 positioned as a center, under vacuum or reduced pressure. In so doing, the insulating layer 104 flows inside the opening 102a from the both sides so as to be filled. The conductor 110 is formed in a manner that a through-hole 104a is provided in the insulating layer 104 within the opening 102a and copper plating is applied on the inner surface of this through-hole. Note that an insulator 112 is further embedded in the through-hole 104a where the conductor 110 is provided.

Further, in recent years, the small size and thinning of the circuit board is demanded ever strongly. In order to achieve this, the opening 102a provided on the metal plate 102 needs to be made smaller, and the insulating layer and the like need to be thinned.

However, when the opening 102a in the metal plate 102 undergoes a process of miniaturization, void is likely to be formed within the opening 102a when the insulating layer 104 is formed by thermocompression boding. For this reason, even if the through-hole 104a is provided and the conductor 110 is formed in a state where the void stays therein, the film thickness of the insulating layer 104 in a position where the void is still contained becomes thinner locally. This causes a problem that a dielectric breakdown strength between the metal plate 102 and the conductor 110 cannot be ensured. Further, when the insulating layer 104 is thinned, the thinned insulating resin sheets are subjected to thermocompression boding and the insulating layer 104 flows inside the opening 102a. This produces a dent in the insulating layer 104 at an upper region of the opening 102a. Accordingly, the thickness of the insulation layer 104 becomes relatively thin in the vicinity of the opening 102a of the metal plate 102. As a result, the dielectric breakdown strength between the metal plate 102 and the conductor 110 (wiring pattern 114) is likely to be insufficient. In particular, since electric field tends to converge to a corner (opening end) of the metal plate 102, the dielectric breakdown strength becomes more problematic.

SUMMARY OF THE INVENTION

The present invention has been made in view of the foregoing circumstances and a general purpose thereof is to suppress the deterioration of dielectric breakdown strength due to an opening in a metal plate and enhance the reliability of a circuit board.

One embodiment of the present invention relates to a circuit board. The circuit board comprises: a substrate made principally of metal; an opening provided on the substrate; a first wiring layer provided on one surface of the substrate via a first insulating layer; a second wiring layer provided on the other surface of the substrate via a second insulating layer; and a conductor which penetrates the substrate via the opening and which connects the first wiring layer with the second wiring layer, wherein an end of the opening at one surface side of the substrate has a tapering form on a surface layer thereof.

According to this structure, a taper shape is formed at an opening end of the metal plate, the insulating layers can be filled while the occurrence of void in an opening of the metal plate is being suppressed. Hence, the insulating layers (first insulating layer and second insulating layer) lie evenly between the metal plate and the conductor. As a result, the dielectric breakdown strength between the metal plate and the conductor is secured. Since the taper shape is formed at an opening end of the metal plate, the electric field generated in the opening end of the metal plate is dispersed. Thus, the insulation resistance between the metal plate and the conductor (or wiring pattern) is improved. As a result of these, the reliability as a circuit board is improved.

In the above structure, the tapering form is preferably such that a size of the opening increases in a direction from an end of the opening at the other surface side of the substrate toward the end of the opening at one surface side of the substrate. By this arrangement, the flow of the first insulating layer into the opening of the metal plate along the tapering form is facilitated. Accordingly, the insulating layers (first insulating layer and second insulating layer) without void can be easily provided in the opening of the metal plate. As a result, a circuit board with increased insulation resistance can be obtained with ease.

In the above structure, the first insulating layer may have a recess on an upper surface thereof in an upper region of the opening. In this case, the opening end of the metal plate is of a taper shape. Thereby, the insulating layer flows into the opening in a stepwise manner such that it flows from an upper portion of the metal plate moving along with the taper shape. This can suppress the fast flow of the first insulating layer from the upper portion of the metal plate onto the opening as observed in the conventional practice. Accordingly, even if the first insulating layer is thinned, a certain thickness of the first insulating layer can be secured in the vicinity of the opening of the metal plate. As a result, the insulation resistance between the metal plate and the conductor(first wiring layer) is ensured and the reliability as a circuit board is improved. Also, since the thickness of the insulating layers (first insulating layer and second insulating layer) in the opening of the metal plate is thinner than in a case when there is no recess in the surface of the first insulating layer, the processing accuracy at the time of a formation of the conductor is improved. For this reason, a circuit board with increased insulation resistance can be obtained with ease.

The end of the opening at the other surface side of the substrate may have at least the tapering form at a surface layer thereof. Also, the tapering form provided in the end of the opening at the other surface side of the substrate may be such that a size of the opening increases in a direction from an end of the opening at the one surface side of the substrate toward the end of the opening at the other surface side of the substrate. Also, the second insulating layer may have a recess on an lower surface thereof in a lower region of the opening.

Another embodiment of the present invention relates to a semiconductor module. The semiconductor module comprises: any of the above-described circuit board; and a circuit element mounted on the circuit board.

Still another embodiment of the present invention relates to a method for manufacturing a circuit board. The method for manufacturing a circuit board comprises: forming an opening in a metal plate so that an opening size increases in a direction from a lower surface side toward an upper surface side; embedding the opening with insulating layers by thermally-bonding insulating layers with metal films from the upper side and the lower side of the metal plate, respectively; forming a through-hole through the insulating layers embedded in the opening; forming a conductor in the penetrating hole; and forming wiring layers on the upper side and the lower side of the metal plate, respectively, by patterning the metal films provided on the upper side and the lower side of the metal plate, respectively.

Still another embodiment of the present invention relates also to a method for manufacturing a circuit board. The method for manufacturing a circuit board comprises: forming an opening in a metal plate so that an opening size increases in a direction from a central portion toward an upper surface side and an opening size increases in a direction from the central portion toward a lower surface side; embedding the opening with insulating layers by thermally-bonding insulating layers with metal films from the upper side and the lower side of the metal plate, respectively; forming a through-hole through the insulating layers embedded in the opening; forming a conductor in the through-hole; and forming wiring layers on the upper side and the lower side of the metal plate, respectively, by patterning the metal films provided on the upper side and the lower side of the metal plate, respectively.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
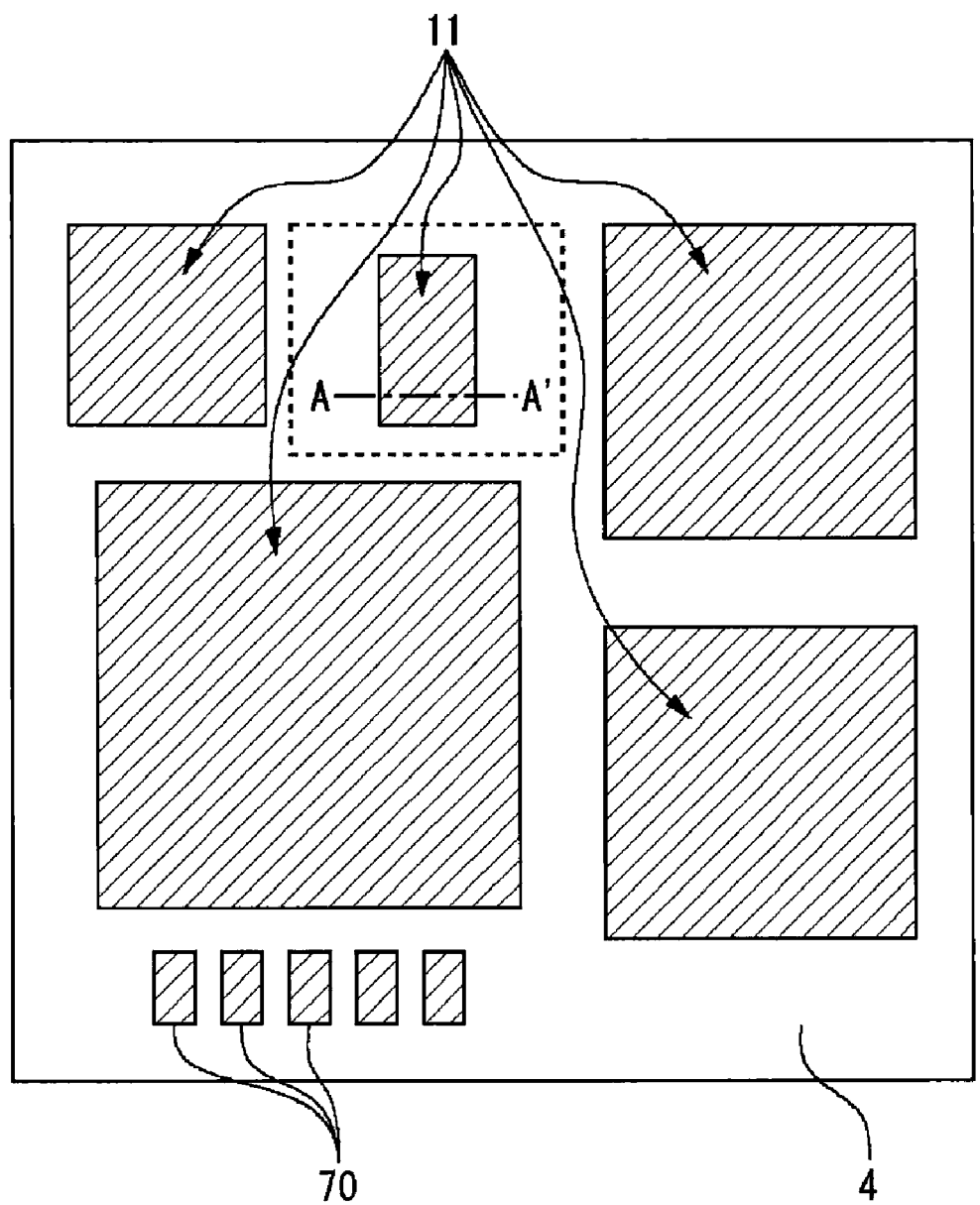
FIG. 1 is a plain view showing an overall structure of a semiconductor module using a circuit board provided with a metal plate according to a first embodiment of the present invention.

The invention will now be described based on the preferred embodiments with reference to Figures. In all Figures, the identical components are given the same reference numerals or symbols and the description thereof is omitted as appropriate. In this patent specification, the "upward" direction is so defined that the direction in which an LSI chip exists relative to a metal plate is upward.

First Embodiment

Figure 2:
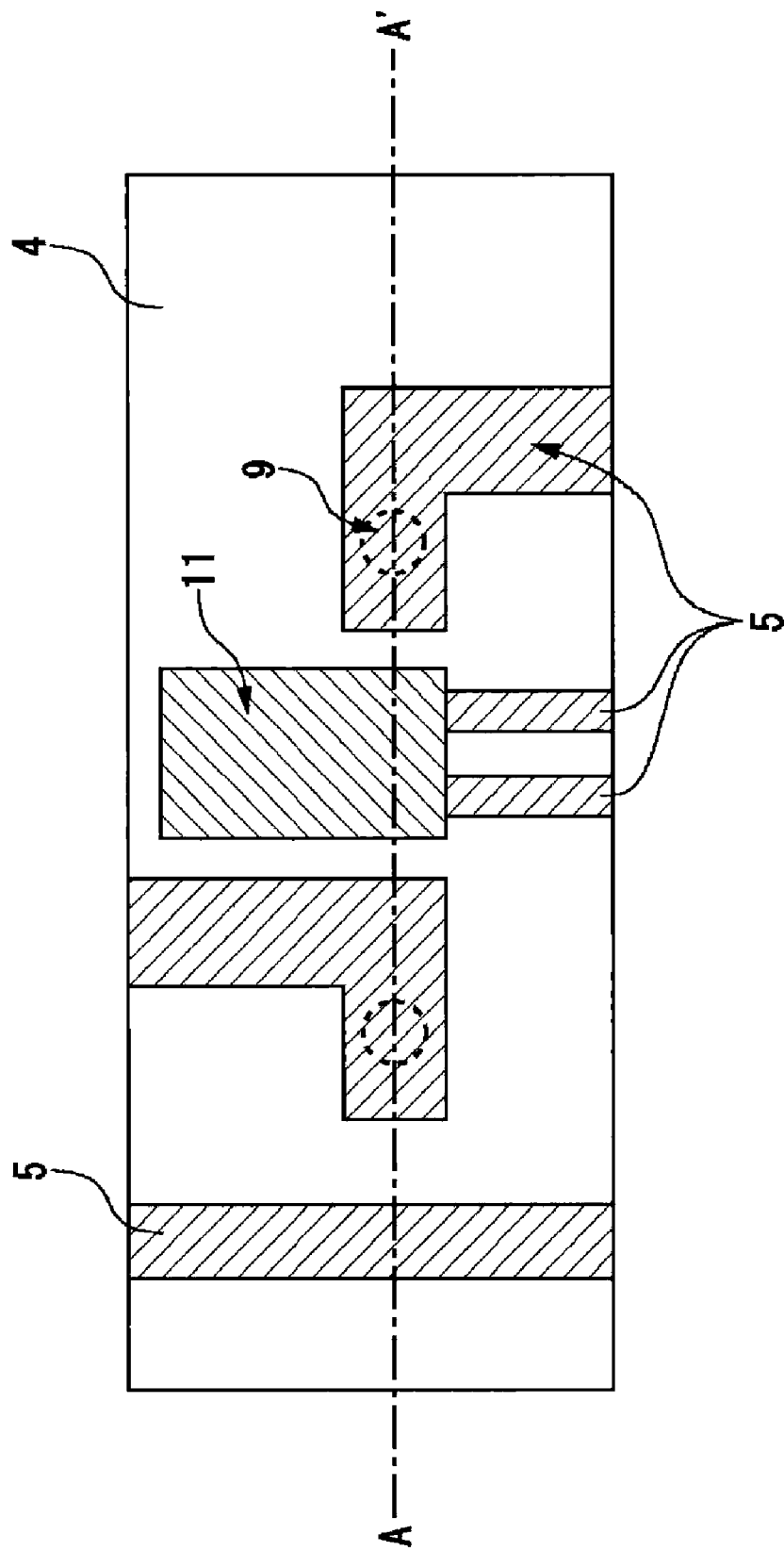
FIG. 2 is an enlarged view showing a chief part of FIG. 1 enclosed by dotted lines.
Figure 3:
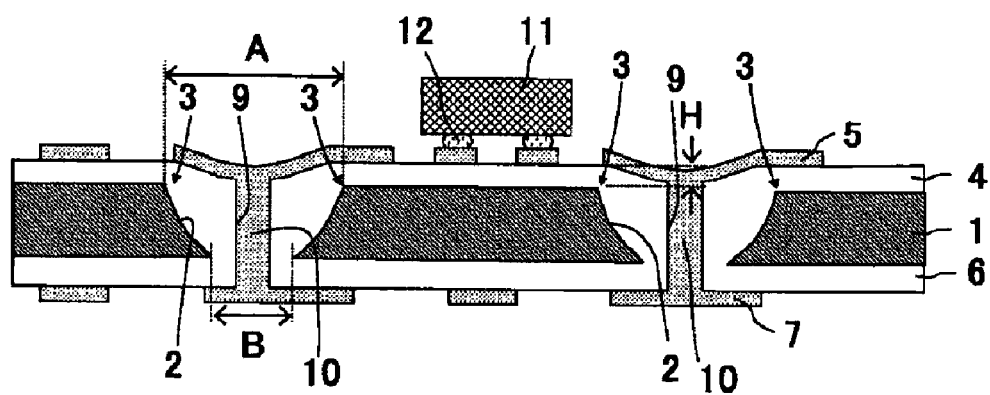
FIG. 3 is a schematic cross-sectional view, taken along a line A-A' of FIG. 2, showing a circuit board provided with a meal plate according to a first embodiment of the present invention.

FIG. 1 is a plain view showing an overall structure of a semiconductor module using a circuit board provided with a metal plate according to a first embodiment of the present invention. FIG. 2 is an enlarged view showing a major part of FIG. 1 enclosed by dotted lines. FIG. 3 is a schematic cross-sectional view, taken along a line A-A' of FIG. 2, showing a circuit board provided with a meal plate according to the first embodiment of the present invention. As shown in FIG. 1, the semiconductor module according to the first embodiment is a so-called multi chip module (MCM) having a structure wherein a plurality LSI chips 11 and a plurality of passive components such as resistors and capacitors are mounted above an insulating layer 4 that constitutes a circuit board. As shown in FIG. 2, a wiring pattern 5 is formed on the insulating layer 4. Through-holes 9 penetrating a metal plate are formed below predetermined areas. A detailed description of the through-hole 9 will be given later.

Referring to FIG. 3, in a circuit board according to the first embodiment, a metal plate 1 having an opening 2 is provided as a core material and the opening 2 is so provided that the dimensions of the opening 2, namely the size of the opening 2, becomes wider (larger) gradually from a lower surface side thereof toward an upper surfer side thereof. On both sides of this metal plate 1, wiring patterns 5 and 7 are provided via insulating layers 4 and 6, respectively. Here, the insulating layer 4 in the upper region of the opening 2 has a recess on the top surface thereof. In order to electrically connect each wiring pattern, there is provided a conductor 10 which penetrates the metal plate 1 via the opening 2 and which connects the wiring pattern 5 with the wiring pattern 7. Further, an LSI chip 11 is directly connected with the upper surface side of metal plate 1 through solder balls 12. Note that the insulating layer 4 is an example of a "first insulating layer" and the wiring pattern 7 is an example of a "second wiring layer" in WHAT IS CLAIMED.

More specifically, a metal plate 1 whose thickness is about 50 μm to 1 mm (150 μm, for instance) is used, as a core material, for the circuit board according to the first embodiment of the present invention. For example, a copper plate is used as this metal plate 1. The metal plate 1 may be formed of a cladding member comprised of a stack of a lower metal layer made of copper, an intermediary metal layer, made of Fe—Ni type alloy (so-called invar alloy), which is formed on the lower metal layer, and an upper metal layer, made of copper, which is formed on the intermediary metal layer.

In the metal plate 1, the openings 2 penetrating the metal plate 1 are formed at predetermined positions by wet etching processing. For example, the dimensions A of an opening 2 at an upper surface side is about 450 μm and the dimensions B of an opening 2 at a lower surface side is about 300 μm. Here, the opening 2 is formed in a manner such that the dimensions or size of the opening 2 becomes wider gradually from the lower surface side toward the upper surface side. Also, at an end of the opening on the upper surface side there is formed a corner 3 whose angle is less inclined than in the conventional case.

On the upper surface side and the lower surface side of the metal plate 1, there are formed the insulating layers 4 and 6 having the thickness of about 60 μm to 150 μm (for example, about 75 μm) formed of epoxy resin as the main component. In this case, the opening 2 in the metal plate 1 is embedded completely with the insulating layers 4 and 6 without creating any void in the openings of the metal plate 1. The insulating layer 4 in the upper region of the opening 2 is provided in a manner such that the upper surface has a recess of H (H being a recessed amount in depth). A filler having a diameter of about 2 μm to 10 μm may be added to the insulating layers 4 and 6 formed of epoxy resin as the main component. Such a filler includes alumina ($Al_2O_3$), silica ($SiO_2$), aluminum nitride (AlN), silicon nitride (SiN) and boron nitride (BN). A weight filling factor is about 30 to 80 percent.

The wiring patterns 5 and 7, made of copper, having the thickness of about 30 μm are formed on the insulating layers 4 and 6, respectively, so that electrical conduction with each wiring pattern is achieved by the conductor 10 (diameter: about 150 μm). Further, as a semiconductor chip, the LSI chip 11 is connected, via the solder balls 12, on the wiring pattern 5. The wiring pattern 5 in the upper area of the opening 2 is provided along with the above-described insulating layer 4 so that a recess is formed.

(Fabricating Method)

FIGS. 4A to 4D and FIGS. 5A to 5C are schematic cross-sectional views to explain a process of fabricating a circuit board, shown in FIG. 1, according to the first embodiment of the present invention.

Figure 4A:
FIGS. 4A to 4D are schematic cross-sectional views to explain a process of fabricating a circuit board, shown in FIG. 3, according to a first embodiment of the present invention.

As shown in FIG. 4A, prepared first is a metal plate 1 having the thickness of about 50 μm to 1 mm (about 150 μm, for instance). For example, a copper plate is used as this metal plate 1. The metal plate 1 may be formed of a cladding member comprised of a stack of a lower metal layer made of copper, an intermediary metal layer, made of Fe—Ni type alloy (so-called invar alloy), which is formed on the lower metal layer, and an upper metal layer, made of copper, which is formed on the intermediary metal layer.

Figure 4B:
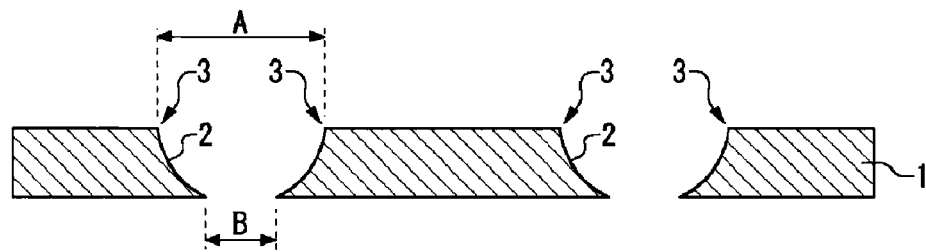

As shown in FIG. 4B, a resist pattern (not shown) is provided on the metal plate 1 and then openings 2 penetrating the metal plate 1 are formed at predetermined positions by performing wet etching processing. For example, the dimensions A of an opening 2 at an upper surface side is about 450 μm and the dimensions B of an opening 2 at a lower surface side is about 300 μm. Here, since part of the metal plate 1 is removed isotropically by the wet etching processing, the opening 2 is formed in a manner such that the dimensions or size of the opening 2 becomes wider gradually from the lower surface side toward the upper surface side. Also, at an end of the opening on the upper surface side there is formed a corner 3 whose angle is less inclined than in the conventional case.

Figure 4C:
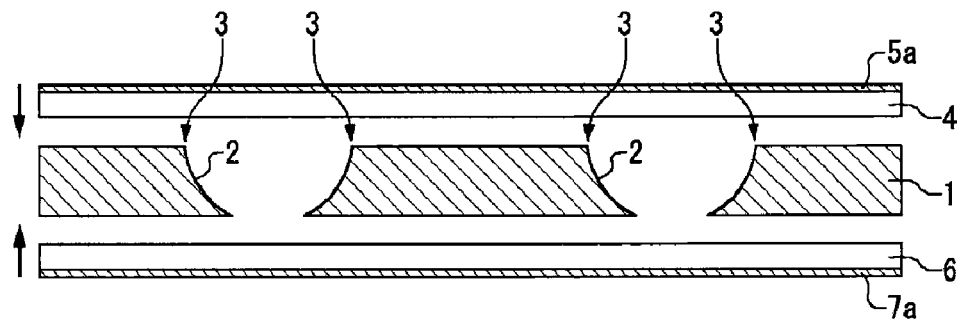

As shown in FIG. 4C, an insulating layer 4 with a copper foil 5a is thermally bonded from the upper surface of the metal plate 1 under vacuum or reduced pressured, whereas an insulating layer 6 with a copper foil 7a is thermally bonded from the lower surface side under vacuum or reduced pressure. Here, the thickness of the insulating layers 4 and 6 is, for example, about 75 μm, whereas the thickness of the copper foils 5a and 7a is, for example, about 10 μm. The aforementioned material is used as the insulating layers 4 and 6.

Figure 4D:
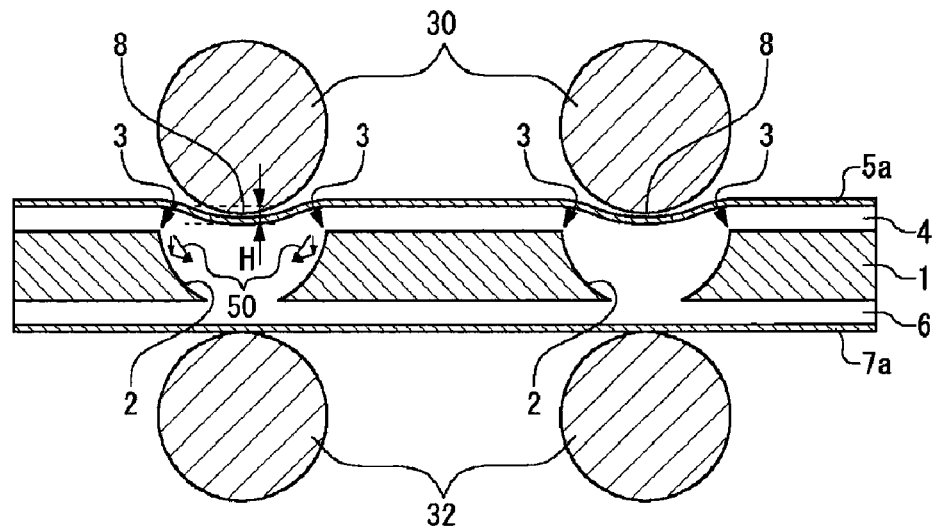

By pressure-bonding the insulating layers with the copper foils, the opening 2 in the metal plate 1 is embedded completely with the insulating layers 4 and 6 without creating any void in the openings 2 of the metal plate 1, as shown in FIG. 4D. More specifically, in the thermocompression bonding process of the insulating layer 4 and the insulating layer 6, the metal plate 1 is interposed between a pressure-bonding roller 30 and a pressure-bonding roller 32 disposed counter thereto. Then, the insulating layer 4 is pressed with the pressure-bonding roller 30 from the upper surface side of the metal plate 1 and, at the same time, the insulating layer 6 is pressed with the pressure-bonding roller 32 from the lower surface side of the metal plate 1. Note that the pressure-bonding rollers 30 and 32 are preferably rotatable. The thermocompression bonding processing is carried out using the pressure-bonding rollers 30 and 32 in a state such that a tapered shape is provided in an opening end of the metal plate 1. Thereby, a downward force is transformed to a force of vectors 50 inside the opening. This suppresses the generation of void inside the opening.

Here, the upper surface of the insulating layer 4 (or the copper foil 5a) in the upper area of the opening 2 has a recess (depressed portion) 8. When the insulating layers 4 and 6 are subjected to thermocompression bonding, pressure is applied on the metal plate 1 in the vertical direction (up-down direction). Since the upper surface side of the opening 2 of the metal plate 1 is of a tapered shape, forces in parallel directions are produced in the opening 2. This force accelerates a flow of the insulating layer into the opening 2. Thereby, the flow of the insulating layer into the opening 2 occurs selectively from the upper surface side, which causes a recess in the insulating layer 4 formed in the upper surface side of the opening 2. The depth of this recess (recessed amount) is about 20 μm.

Figure 5A:
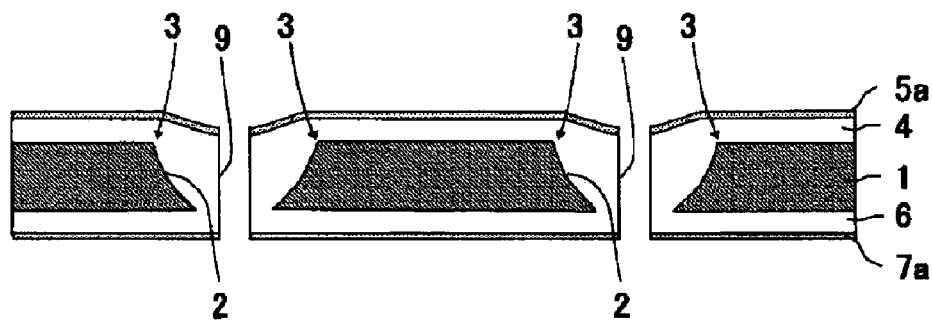
FIGS. 5A to 5C are schematic cross-sectional views to explain a process of fabricating a circuit board, shown in FIG. 3, according to a first embodiment of the present invention.

As shown in FIG. 5A, the insulating layers 4 and 6 embedded in the opening of the metal plate 1 are subjected to laser irradiation or drill process. This forms the through-holes 9 (diameter: about 150 μm), at position corresponding to the openings, by which to joint together the copper foils on the both surfaces by penetrating the insulating layers 4 and 6.

Figure 5B:
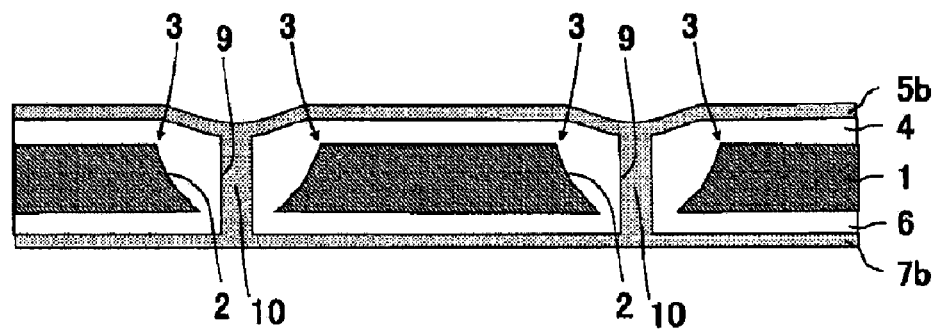

As shown in FIG. 5B, copper is plated at the thickness of about 0.5 μm by using electroless plating, on the upper surface of the copper foil 5a, on the inner surface of the through-hole 9 and on the upper surface of the copper foil 7a. Subsequently, the plating is carried out by using electrolytic plating, on the upper surface of the copper foil 5a, on the inner surface of the through-hole 9 and on the upper surface of the copper 7a. Note that in the present embodiment, an inhibitor and an accelerator are added in the plating liquid, so that the inhibitor is adsorbed on the upper surfaces of the copper foils 5a and 7a and at the same time the accelerator is adsorbed on the inner surface of the through-hole 9. Since this makes the copper plating on the inner surface of the through-hole 9 thicker, it is now possible to embed copper in the through hole 9. As a result, wiring layers 5b and 7b made of copper whose thickness is about 30 μm are formed on the insulating layers 4 and 6, respectively. At the same time, the conductor 10 made of copper is embedded in the through-hole 9

Figure 5C:
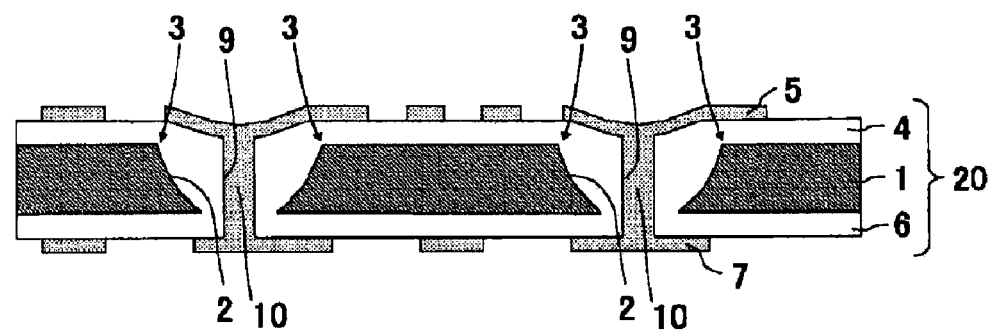

As shown in FIG. 5C, patterning of the wiring layers 5b and 7b is carried out by using photolithography and etching techniques. This results in the formation of a wiring pattern 5 and a wiring patter 7.

Finally, as shown in FIG. 3, the LSI chips 11 are mounted on the wiring pattern 5 so that the LSI chips 11 are electrically connected with the wiring pattern 5 via solder balls 12, and they are fixed by a resin layer (not shown).

By employing these processes, a circuit board provided with the metal plate 1 according to the first embodiment is manufactured.

According to the circuit board of the first embodiment as described above, advantageous effects are achieved as follows.

(1) Since a taper shape is formed at an opening end of the metal plate 1, the insulating layers 4 and 6 can be filled while the occurrence of void in an opening of the metal plate 1 is being suppressed. Hence, the insulating layers 4 and 6 lie evenly between the metal plate 1 and the conductor 10. As a result, the dielectric breakdown strength between the metal plate 1 and the conductor 10 is secured, thus enhancing the reliability as a circuit board.

(2) Since the opening end of the metal plate 1 is of a taper shape, the electric field generated in the opening end (corner 3) of the metal plate 1 is dispersed. The insulation resistance between the metal plate 1 and the conductor (or wiring pattern 5) is improved. As a result, the reliability as a circuit board is improved.

(3) A tapering form of the opening 2 is provided so that the dimensions, namely the size, of the tapering form increases from an opening end at a lower surface side of the metal plate 1 toward an opening end at an upper surface side of the metal plate 1. Thus, facilitated is the flow of the insulating layer 4 into the opening 2 of the metal plate 1 along the tapering form at the time of thermocompression bonding. Accordingly, the insulating layer without void can be easily provided in the opening 2 of the metal plate 1. As a result, a circuit board with increased insulation resistance can be obtained with ease.

(4) In a case when an upper surface of the insulating layer 4 is provided such that the upper surface thereof has a recess in an upper area of the opening 2, the opening end of the metal plate 1 is of a taper shape. Thereby, the insulating layer 4 flows into the opening in a stepwise manner such that it flows from an upper portion of the metal plate 1 moving along with the taper shape. This can suppress the fast flow of the insulating layer 4 from the upper portion of the metal plate 1 onto the opening 2 as in the conventional practice. Accordingly, even if the insulating layer 4 is thinned, a certain thickness of the insulating layer 4 can be secured in the vicinity of the opening 2 of the metal plate 1. As a result, the insulation resistance between the metal plate 1 and the conductor 10 (or the wiring pattern 5) is ensured and the reliability as a circuit board is improved.

(5) In a case when the upper surface of the insulating layer 4 is provided such that the upper surface thereof has a recess in an upper area of the opening 2, the thickness of the insulating layers 4 and 6 in the opening 2 of the metal plate 1 is thinner than in a case when there is no recess in the surface of the insulating layer 4. Thus, the processing accuracy at the time of a formation of the conductor 10 (or through-hole 9) is improved. For this reason, a circuit board with increased insulation resistance can be obtained with ease.

Second Embodiment

Figure 6:
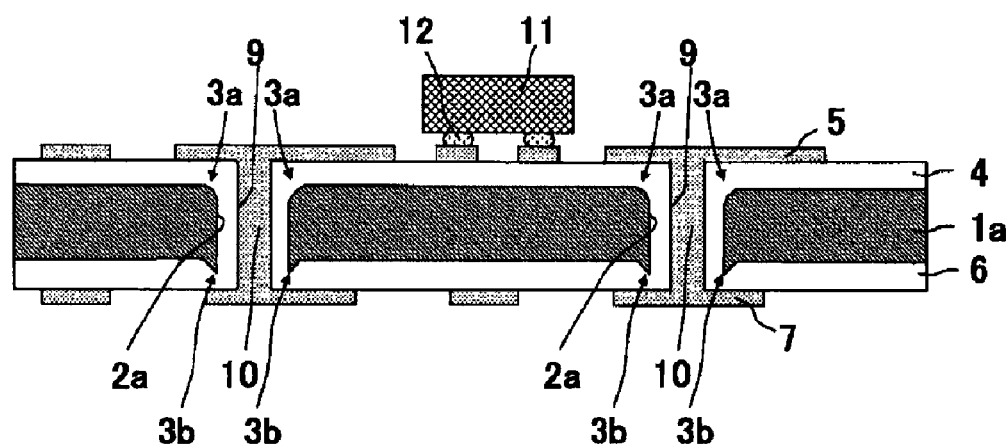
FIG. 6 is a schematic cross-sectional view showing a circuit board provided with a metal plate according to a second embodiment of the present invention.

FIG. 6 is a schematic cross-sectional view showing a circuit board provided with a metal plate according to a second embodiment of the present invention. What the second embodiment differs from the first embodiment is as follows. That is, an opening 2a of a metal plate 1a is provided such that the metal plate 1a has a settling (rounded corner) 3a at an end on the upper surface side of the metal plate 1a and it has a projection 3b at an end on the lower surface side of the metal plate 1a. Other than these differences, the second embodiment is the same as the first embodiment.

The above-described opening 2 is formed by subjecting it to laser irradiation or drill process from the upper surface side. Thereby, the settling (rounded corner) 3a is so formed as to follow the end on the upper surface side of the opening 2a, and the projection 3b (about 10 μm) is so formed as to follow the end on the lower surface side of the opening 2. The dimensions of the opening 2 that penetrates the metal plate 1a is about 300 μm.

According to the circuit board of the first embodiment as described above, the following advantageous effect is achieved.

(6) An upper surface portion of the opening 2 in the metal plate 1a is provided with a rounded shape so that the dimensions, namely the size, of the opening 2 increases from an opening end at a lower surface side of the metal plate 1 toward an opening end at an upper surface side of the metal plate 1. Thus, facilitated is the flow of the insulating layer 4 into the opening 2 of the metal plate 1 along a taper shape at the time of thermocompression bonding. Accordingly, the insulating layer without void can be easily provided in the opening 2 of the metal plate 1. As a result, a circuit board with increased insulation resistance can be obtained with ease.

Third Embodiment

Figure 7:
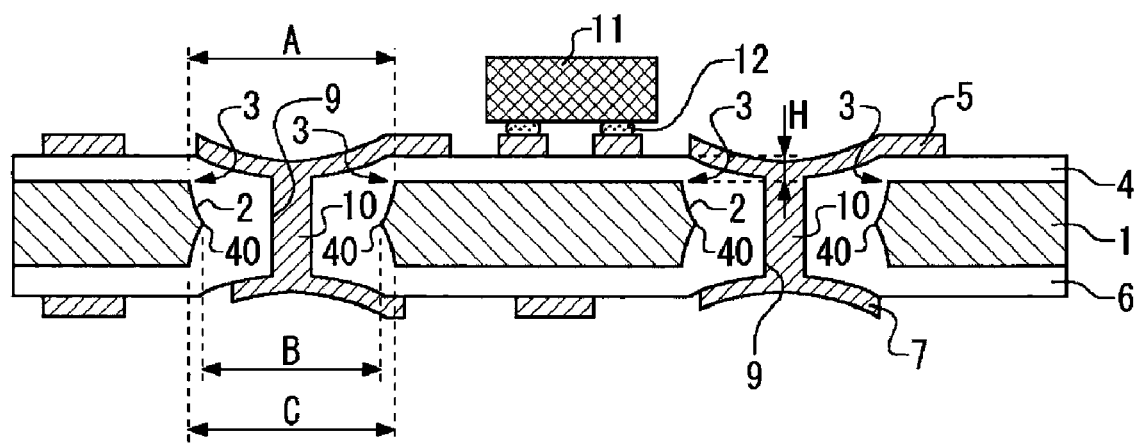
FIG. 7 is a schematic cross-sectional view showing a circuit board provided with a metal plate according to a third embodiment of the present invention.

FIG. 7 is a schematic cross-sectional view showing a circuit board provided with a metal plate according to a third embodiment of the present invention.

In the circuit board according to the third embodiment, the dimensions (opening diameter, opening size or opening dimensions) of an opening 2 provided in a metal plate 1 is minimum in a central portion 40 in the thickness direction of the metal plate 1. The opening 2 is formed in a manner such that the opening size increases in a direction from the central portion 40 toward the upper surface side and the opening size increases in a direction from the central portion 40 toward the lower surface side. That is, upper-surface-side opening dimensions A is larger than opening dimensions B in the central portion, and lower-surface-side opening dimensions C is larger than the opening dimensions B in the central portion.

An insulating layer 4 in an upper area of the opening 2 is provided so that the insulating layer 4 has a recess on the upper surface thereof. An insulating layer 6 in a lower area of the opening is provided so that the insulating layer 6 has a recess on the lower surface thereof. A wiring pattern 5 in an upper area of the opening 2 is provided along with the above-described insulating layer 4 so that a recess is formed.

(Fabricating Method)

FIGS. 8A to 8D are schematic cross-sectional views to explain a process of fabricating a circuit board, shown in FIG. 7, according to the third embodiment of the present invention.

Figure 8A:
FIGS. 8A to 8D are schematic cross-sectional views to explain a process of fabricating a circuit board, shown in FIG. 7, according to a third embodiment of the present invention.

As shown in FIG. 8A, a metal plate 1 is first prepared. The detail on the metal plate 1 is as described in connection with FIG. 4A.

Figure 8B:
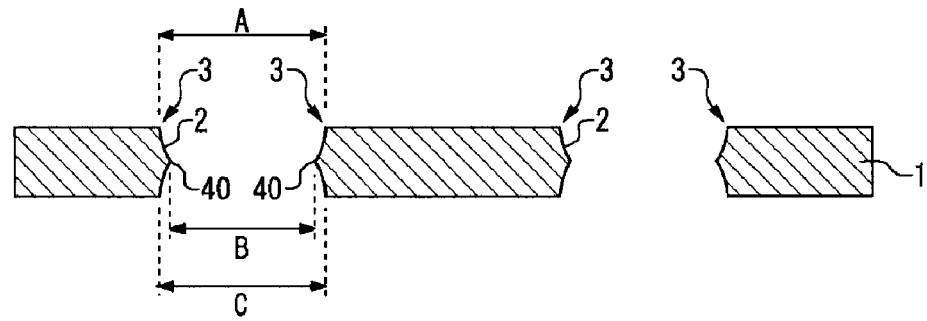

As shown in FIG. 8B, resist patterns (both not shown) are provided on and under the metal plate 1, respectively, and then openings 2 penetrating the metal plate 1 are formed at predetermined positions by performing wet etching processing. For example, the dimensions A of an opening at an upper surface side is about 350 μm; the opening dimensions B in the central portion is about 300 μm; and the dimensions C of an opening at a lower surface side is about 350 μm. Note that the resist patterns provided on and under the metal plate 1, respectively, have openings disposed counter to each other at predetermined positions. Here, the metal plate 1 is removed isotropically, by the wet etching processing, at the openings of the resist patterns provided on and under the metal plate 1, respectively. Thus, The opening 2 is formed in a manner such that the opening size increases in a direction from the central portion 40 toward the upper surface side and the opening size increases in a direction from the central portion 40 toward the lower surface side. Also, at each end of the openings in the upper surface side and the lower surface side there is formed a corner 3 whose angle is less inclined than in the conventional case.

Figure 8C:
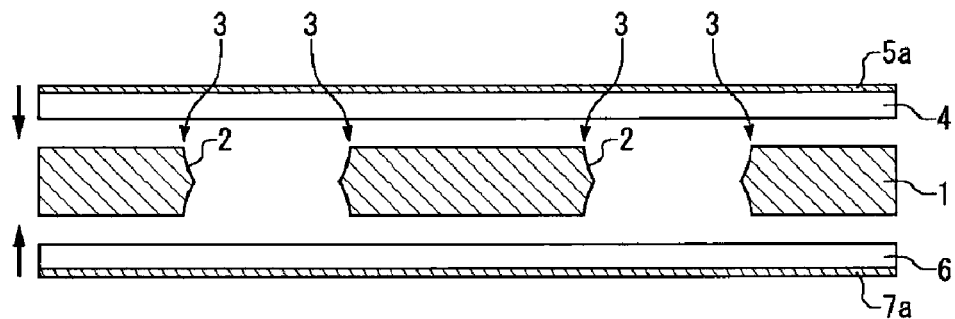

Then, as shown in FIG. 8C, an insulating layer 4 with a copper foil 5a and an insulating layer 6 with a copper foil 7a are thermally bonded from the upper surface and the lower surface of the metal plate 1, respectively, under vacuum or reduced pressured. Here, the thickness of the insulating layers 4 and 6 is, for example, about 75 μm, whereas the thickness of the copper foils 5a and 7a is, for example, about 10 μm. The aforementioned material is used as the insulating layers 4 and 6.

Figure 8D:
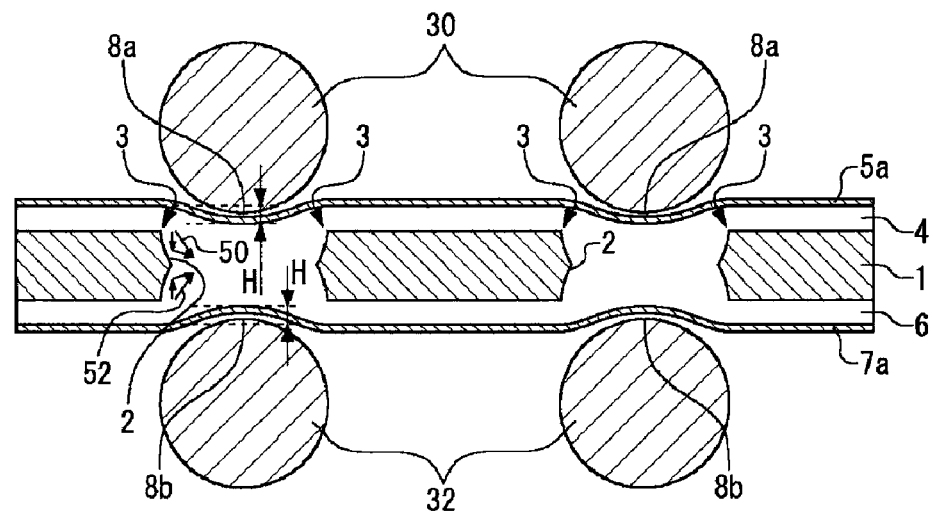

By pressure-boding the insulating layers with the copper foils, the opening 2 in the metal plate 1 is embedded completely with the insulating layers 4 and 6 without creating any void in the openings 2 of the metal plate 1, as shown in FIG. 8D. More specifically, in the thermocompression bonding process of the insulating layer 4 and the insulating layer 6, the metal plate 1 is interposed between a pressure-bonding roller 30 and a pressure-bonding roller 32 disposed counter thereto. Then, the insulating layer 4 is pressed with the pressure-bonding roller 30 from the upper surface side of the metal plate 1 and, at the same time, the insulating layer 6 is pressed with the pressure-bonding roller 32 from the lower surface side of the metal plate 1. Note that the pressure-bonding rollers 30 and 32 are preferably rotatable. The thermocompression bonding processing is carried out using the pressure-bonding rollers 30 and 32 in a state such that a tapered shape is provided in an opening end of the metal plate 1. Thereby, a downward force is transformed to a force of vectors 50 inside the opening, and a downward force is transformed to a force of vectors 52 inside the opening. This suppresses the generation of void inside the opening.

Here, the upper surface of the insulating layer 4 (or the copper foil 5a) in the upper area of the opening 2 has a recess (depressed portion) 8a. Also, the lower surface of the insulating layer 6 (or the copper foil 7a) in the lower area of the opening 2 has a recess (depressed portion) 8b. When the insulating layers 4 and 6 are subjected to thermocompression bonding, pressure is applied on the metal plate 1 in the vertical direction (up-down direction). Since the upper surface side and the lower surface side of the opening 2 of the metal plate 1 are of a tapered shape, forces in parallel directions (in a direction toward a central axis of the opening 2) are produced at the upper surface side and the lower surface side of the opening 2 of the metal plate 1. This force accelerates the flow of the insulating layer into the opening 2. Thereby, the flow of the insulating layer into the opening 2 occurs selectively from the upper surface side and the lower surface side of the opening 2, which causes a recess in the insulating layer 4 formed in the upper surface side of the opening 2 and a recess in the insulating layer 6 formed in the lower surface side of the opening 2. The depth of this recess (recessed amount) H is about 20 μm.

Then, processes similar to those shown in FIGS. 5A to 5C are carried out to successively perform the formation of the through-hole 9, the embedding of the conductor 10 and the patterning of the wiring layers 5b and 7b. Finally, as shown in FIG. 7, the LSI chips 11 are mounted on the wiring pattern 5 so that the LSI chips 11 are electrically connected with the wiring pattern 5 via solder balls 12, and they are fixed by a resin layer (not shown). This completes manufacturing a circuit board provided with the metal plate according to the third embodiment.

According to the circuit board of the third embodiment as described above, advantageous effects are achieved as follows.

(7) Since a taper shape is each formed at an opening end at the upper surface side of the metal plate 1 and an opening end at the lower surface side thereof, so that the above-described advantageous effects of (1) to (6) can be enjoyed at the both upper surface side and the lower surface side of the metal plate 1. Since in particular the opening ends at the upper surface side and the lower surface side of the metal plate 1 are of a taper shape, respectively, the electric field produced at the opening ends of the metal plate 1 is dispersed at the upper surface side and the lower surface side. As a result, the insulation resistance between the metal plate 1 and the conductor 10 (or wiring patterns 5 and 7) is improved.

Compared with a case where the opening end of the metal plate 1 has a taper shape at one surface side, the difference between the maximum dimensions and the minimum dimensions in the opening dimensions is small. Hence, the metal plate is stable in terms of maintaining its shape.

(9) When the through-hole having the opening dimensions B in the central portion is opened, the upper-surface-side opening dimensions A can be made smaller (as compared with the first embodiment where the opening is performed from one side only) by performing the opening from the both sides as in the third embodiment. As a result, the circuit board can be further made smaller.

Although in the above embodiments the present invention is applied to a circuit board on which the LSI chips 11 are mounted, the present invention is not limited thereto and applicable to a circuit board on which circuit elements other than the LSI chips are mounted. For example, the circuit elements may be passive elements such as capacitors and resistors.

Although in the above embodiments the examples have been given where the LSI chips 22 are mounted on the circuit board, the present invention is not limited thereto and applicable to a circuit board on which no LSI chips 11 are mounted, as shown in FIG. 5(D). In such a case, the above advantageous effects are also achieved.

Figure 9:
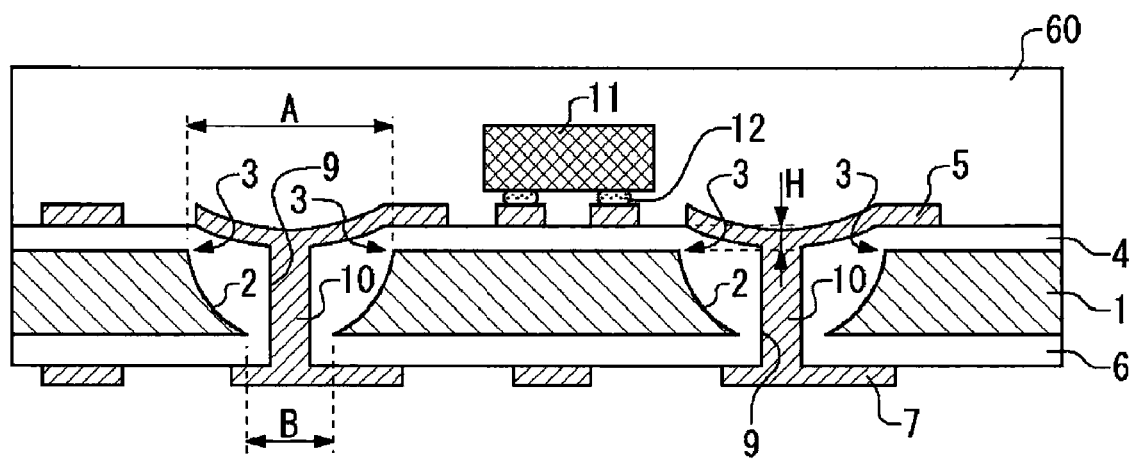
FIG. 9 is a schematic cross-sectional view showing a structure where a molded resin layer is formed on a circuit board according to a first embodiment of the present invention.
Figure 10:
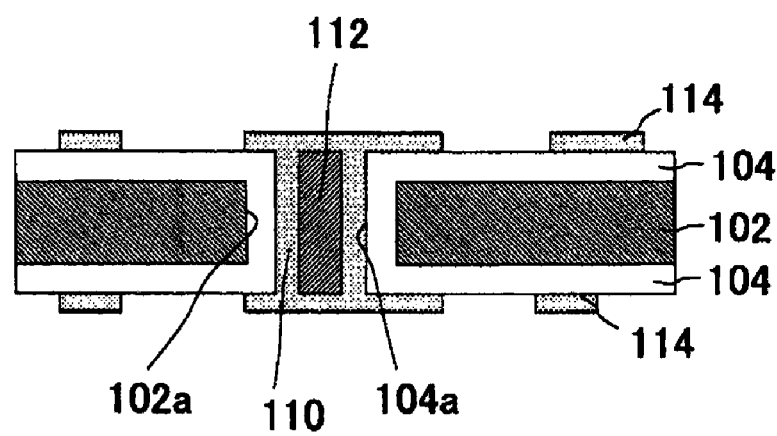
FIG. 10 is a cross-sectional view schematically showing a structure of a conventional circuit board.

Although the LSI chip 11 is exposed in the above embodiments, application can be made to a packaging structure where an encapsulating resin 60 for sealing the LSI chip 11 is formed as shown in FIG. 9. The transfer mold method or the like is used as a method for forming the encapsulating resin 60. Thereby, in addition to the above-described advantageous effects, the LSI chip 11 can be protected against the external influence.

In the first embodiment, an example of the circuit board is shown where the circuit board has the recess 8 on the upper surface of the insulating layer 4. However, the present invention is not limited thereto and, for example, the insulating layer 4 may be provided so that the upper surface of the insulating layer 4 is flat without the provision of the recess. In such a case, the thickness of the insulating layer 4 in the vicinity of the opening 2 of the metal plate 1 becomes thicker. Thus, the insulation resistance between the metal plate 1 and the conductor is sufficiently secured. As a result, the reliability as a circuit board is improved.

In the second embodiment, an example of the circuit board is shown where the metal plate 1 has the settling 3a at an end on the upper surface side of the metal plate 1 and it also has the projection 3b at an end on the lower surface side of the metal plate 1. However, the present invention is not limited thereto and, for example, the rounded corners 3a may be provided on the both surfaces including the lower surface side of the metal plate 1. In this case, the above-described advantageous effects can be obtained on the both surfaces sides of the circuit board.

While the preferred embodiments of the present invention have been described using specific terms, such description is for illustrative purposes only, and it is to be understood that further changes and variations may be made without departing from the spirit or scope of the appended claims.

What is claimed is:

1. A circuit board, comprising:
   a substrate made principally of metal;
   an opening provided on said substrate;
   a first wiring layer provided on one surface of said substrate via a first insulating layer;
   a second wiring layer provided on the other surface of said substrate via a second insulating layer; and
   a conductor which penetrates said substrate via the opening and which connects said first wiring layer with said second wiring layer,
   wherein an end of said opening at one surface side of said substrate has a tapering form on a surface layer thereof, and
   a projection is present at an end of the opening at the other side of the substrate so as to extend along the end.

2. A circuit board according to claim 1, wherein the tapering form is such that a size of said opening increases in a direction from an end of said opening at the other surface side of said substrate toward the end of said opening at one surface side of said substrate.

3. A circuit board according to claim 2, wherein the end of said opening at the other surface side of said substrate has at least the tapering form at a surface layer thereof.

4. A circuit board according to claim 3, wherein the tapering form provided in the end of said opening at the other surface side of said substrate is such that a size of said opening increases in a direction from an end of said opening at one surface side of said substrate toward the end of said opening at the other surface side of said substrate.

5. A circuit board according to claim 1, wherein said first insulating layer has a recess on an upper surface thereof in an upper region of said opening.

6. A circuit board according to claim 5, wherein the end of said opening at the other surface side of said substrate has at least the tapering form at a surface layer thereof.

7. A circuit board according to claim 6, wherein the tapering form provided in the end of said opening at the other surface side of said substrate is such that a size of said opening increases in a direction from an end of said opening at one surface side of said substrate toward the end of said opening at the other surface side of said substrate.

8. A circuit board according to claim 1, wherein the end of said opening at the other surface side of said substrate has at least the tapering form at a surface layer thereof.

9. A circuit board according to claim 8, wherein the tapering form provided in the end of said opening at the other surface side of said substrate is such that a size of said opening increases in a direction from an end of said opening at one surface side of said substrate toward the end of said opening at the other surface side of said substrate.

10. A circuit board according to claim 9, wherein said second insulating layer has a recess on an lower surface thereof in a lower region of said opening.

11. A circuit board according to claim 8, wherein said second insulating layer has a recess on an lower surface thereof in a lower region of said opening.

12. A semiconductor module, comprising:
    a circuit board according to any one of claim 1 to claim 10; and
    a circuit element mounted on said circuit board.

13. The circuit board of claim 1 wherein the projection is part of the substrate.

14. A method for manufacturing a circuit board, comprising:
    forming an opening in a metal plate so that an end of the opening at one surface side of a substrate has a tapering form on a surface layer thereof, and a projection is present at an end of the opening at the other side of the substrate wherein the projection extends along said end;
    embedding the opening with insulating layers by thermally-bonding insulating layers with metal films from the upper side and the lower side of the metal plate, respectively;
    forming a through-hole through the insulating layers embedded in the opening;
    forming a conductor in the through-hole; and
    forming wiring layers on the upper side and the lower side of the metal plate, respectively, by patterning the metal films provided on the upper side and the lower side of the metal plate, respectively.

15. The method of claim 14 wherein the projection is part of the substrate.

* * * * *